(12) United States Patent
Ganivet et al.

(10) Patent No.: US 7,676,642 B2
(45) Date of Patent: Mar. 9, 2010

(54) METHOD FOR INITIALIZING A MEMORY

(75) Inventors: Philippe Ganivet, Bouc Bel Air (FR); Laurent Murillo, Marseille (FR)

(73) Assignee: STMicroelectronics SA, Montrouge (FR)

( * ) Notice: Subject to any disclaimer, the term of this patent is extended or adjusted under 35 U.S.C. 154(b) by 498 days.

(21) Appl. No.: 11/696,863

(22) Filed: Apr. 5, 2007

(65) Prior Publication Data

US 2007/0247955 A1 Oct. 25, 2007

(30) Foreign Application Priority Data

Apr. 7, 2006 (FR) .................... 06 03076

(51) Int. Cl.
*G06F 12/00* (2006.01)
*G06F 13/00* (2006.01)
*G06F 13/28* (2006.01)
*G06F 15/177* (2006.01)
*G06F 9/00* (2006.01)
*G06F 9/24* (2006.01)

(52) U.S. Cl. ........................ 711/166; 711/154; 711/170; 713/1; 713/2

(58) Field of Classification Search ................. 711/154; 713/1, 2
See application file for complete search history.

(56) References Cited

U.S. PATENT DOCUMENTS

| 6,108,598 | A | * | 8/2000 | Sumitani | ..................... 701/29 |
| 6,178,501 | B1 | * | 1/2001 | Ingalls | .......................... 713/1 |
| 6,282,675 | B1 | * | 8/2001 | Sun et al. | ....................... 714/36 |
| 2003/0133338 | A1 | | 7/2003 | Kanda et al. | ................. 365/200 |
| 2007/0070715 | A1 | * | 3/2007 | Kim et al. | .............. 365/189.05 |

* cited by examiner

*Primary Examiner*—Ryan Bertram
(74) *Attorney, Agent, or Firm*—Lisa K. Jorgenson; Robert Iannucci; Seed IP Law Group PLLC

(57) ABSTRACT

A method for initializing a control device of a memory, the control device executing commands for accessing the memory transmitted to the memory by a control signal, the method comprising steps of detecting the switching on of the memory and of at least partially initializing the control device following the switching on of the memory. According to one embodiment of the present invention, the method comprises steps of detecting a specific event in the control signal, and of at least partially initializing the control device following the detection of the specific event.

14 Claims, 4 Drawing Sheets

METHOD FOR INITIALIZING A MEMORY

BACKGROUND OF THE INVENTION

1. Field of the Invention

The present invention relates to memories, and particularly to non-volatile memories such as EEPROM (Electrically Erasable Programmable Read Only Memory) or Flash memories.

The present invention applies more particularly to memories accessible by a serial bus such as an SPI (Serial Peripheral Interface) or an I2C bus.

2. Description of the Related Art

Figure 1:
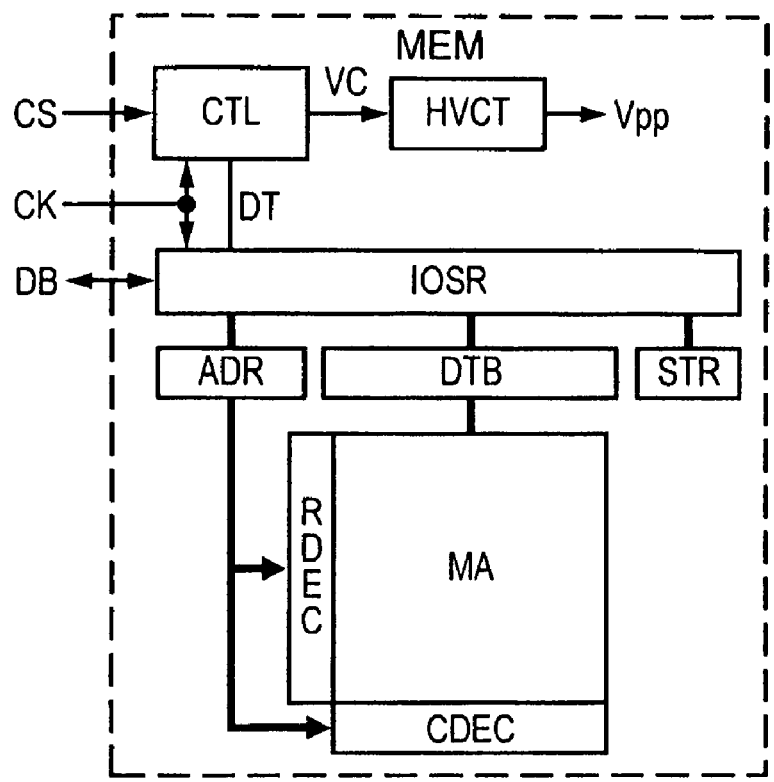

One example of a memory accessible by a serial bus is represented in FIG. 1. The memory MEM represented in FIG. 1 comprises a memory array MA, a control device CTL, a booster circuit HVCT, an address register ADR, a data register DTB, an input/output register IOSR, a status register STR, a line decoder RDEC and a column decoder CDEC.

The control device CTL receives from the external environment a selection signal CS for selecting the memory MEM and a clock signal CK. The device CTL controls the register IOSR and the status register STR, and supplies a control signal VC for controlling the circuit HVCT. The circuit HVCT supplies a high voltage Vpp required to program and erase memory cells of the memory array MA. The register IOSR receives commands and exchanges data with the external environment of the memory through a serial bus DB. The register IOSR is paced by the clock signal CK and receives the commands, data and addresses transmitted by the bus. In write mode, the register ADR receives from the external environment through the serial bus DB and the register IOSR an address of memory cells to be read, programmed or erased, and the register DTB receives data to be stored in the memory array MA. The status register contains information concerning the status of the memory MEM. The address contained in the register ADR is used to control the decoders RDEC and CDEC that enable memory cells to be programmed, to be erased or to be read to be selected according to the address supplied by the address register.

The memory is accessible through read and write commands. The commands applied to the memory are decoded using a finite state machine integrated into the control device CTL.

Figure 2:
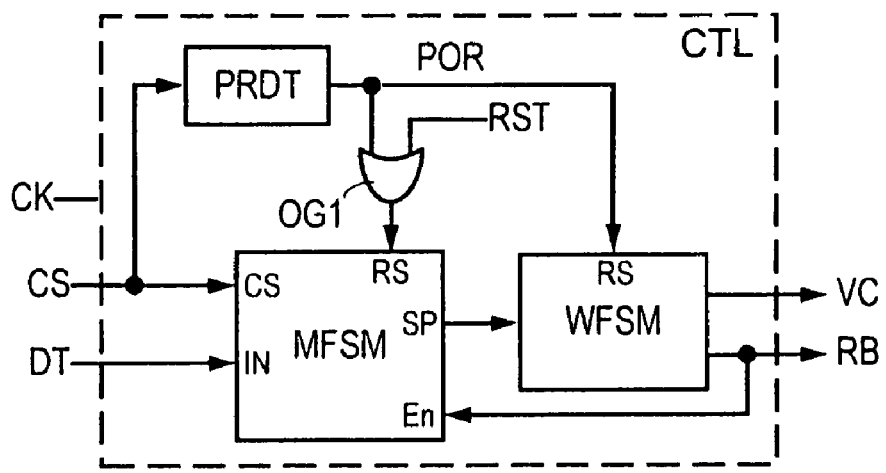

An example of a control device CTL is represented in FIG. 2. In FIG. 2, the control device CTL comprises a clock signal input CK, a main state machine MFSM, a write state machine WFSM and a detector circuit PRDT for detecting the switching on of the memory MEM and generating an initialization signal POR when the memory is switched on.

The state machine MFSM particularly decodes the commands applied to the memory, and activates the write state machine WFSM when the command received is a write command. The state machine WFSM supplies the signal VC that particularly drives the booster circuit HVCT during the phases of writing the memory. The circuit PRDT activates the signal POR following the switching on of the memory (when the supply voltage exceeds a certain threshold value). The state machine MFSM receives the selection signal CS for selecting the memory MEM, and the serial control signal DT transmitted by the bus DB for accessing the memory. The state machine MFSM also receives, through an OR-type logic gate OG1, the initialization signal POR and another initialization signal RST. The signal RST comprises one pulse upon each falling edge of the signal CS. The state machine MFSM supplies the state machine WFSM with a start-write signal SP upon the execution of a write command.

The state machine WFSM is also initialized by the signal POR and supplies the state machine MFSM with a busy signal RB indicating when a write phase is in progress. The signal RB is applied to an activation input En of the state machine MFSM. When the signal RB is active, the state machine MFSM is blocked, but can nonetheless receive and process a command applied to the memory.

The state machines MFSM and WFSM are generally produced using programmable logic arrays PLA. The state machines are initialized using the signal POR when the memory MEM is switched on. In addition, the programmable logic array of the state machine MFSM is initialized by the signal RST at the start of each access to the memory so as to always start in a same well-defined state. The logic circuit around the state machines must also be initialized in a same well-defined state to operate properly.

However, due to certain protocol requirements in particular, certain parts of the device CTL cannot be initialized at the start of the receipt of a command. Thus, the initialization signal RST cannot be applied to the state machine WFSM given that the write commands in the memory are executed following the deselection of the memory (rising back up of the signal CS).

If, for any reason (disturbance on the supply voltage, an electrostatic discharge, failure of the memory cells, etc.), the device CTL is put into an inhibited state, the memory can no longer operate correctly and the reliability of the subsequent accesses to the memory is affected.

In particular, when the memory is write-controlled, the state machine WFSM sends the busy signal RB that blocks the main state machine MFSM while the writing operation is in progress. While the busy signal RB is active, the initialization of the control device CTL, which is normally performed upon each new access to the memory, is not executed following a change of state of the signal CS (the signal RST is not generated). If an operation of writing in the memory has not taken place correctly, the busy signal RB can remain active. Then the result is that the memory is blocked. The only way to restore the memory to a normal state is to temporarily cut off the power supply of the memory. In applications such as motor cars, it is not acceptable to have to cut off the power supply to reset the circuits. Even if the memory is no longer functional, it must still be able to execute read commands.

Thus, it is desirable to reduce the risks of improper operation of the control device of a memory by providing for performing an initialization of the control device which is as complete as that obtained by switching off the circuit.

BRIEF SUMMARY OF THE INVENTION

One embodiment of the present invention provides a memory with a control device that can be completely initialized without switching off the circuit.

Another embodiment of the present invention provides a memory with a control device that is capable of executing a full initialization command, while remaining compatible with the communication protocol between the memory and the external environment.

One embodiment provides a method for initializing a control device of a memory, the control device executing commands for accessing the memory transmitted to the memory by a control signal, the method comprising steps of detecting the switching on of the memory and of at least partially initializing the control device following the switching on of the memory.

According to one embodiment of the present invention, the method comprises steps of detecting a specific event in the control signal, and of at least partially initializing the control device following the detection of the specific event.

According to one embodiment of the present invention, the method comprises a step of initializing an initialization circuit detecting the specific event, following the initialization of the control device.

According to one embodiment of the present invention, the specific event is an initialization command received by the memory.

According to one embodiment of the present invention, the specific event is a write or read command for reading or writing in the memory, not associated with a write or read address.

According to one embodiment of the present invention, a write or read command received by the memory is considered to be an initialization command if a selection signal for selecting the memory changes state before a write or read address is received by the memory, following the receipt of the read or write command.

According to one embodiment of the present invention, the method comprises a step of at least partially initializing the control device if a write command for writing in the memory is still being executed at the end of a maximum write period.

According to one embodiment of the present invention, the at least partial initialization of the control device comprises initializing a main state machine and a write state machine.

One embodiment of the present invention also relates to a memory comprising a control device for executing commands for accessing the memory, received in a control signal applied to the memory, and a detector circuit for detecting the switching on of the memory at least partially initializing the control device following the switching on of the memory.

According to one embodiment of the present invention, the memory comprises an initialization circuit detecting a specific event in the control signal, and at least partially initializing the control device, following the detection of the specific event.

According to one embodiment of the present invention, the initialization circuit is reset at least partially following the initialization of the control device.

According to one embodiment of the present invention, the specific event is an initialization command received by the memory.

According to one embodiment of the present invention, the specific event is a command for writing or reading in the memory, not associated with a write or read address.

According to one embodiment of the present invention, the memory comprises a circuit for detecting the receipt of a write or read command by the memory, followed by a state change in a selection signal for selecting the memory, before a write or read address is received by the memory.

According to one embodiment of the present invention, the memory comprises a time delay circuit that is triggered at the start of the execution of a write command in the memory and which at least partially initializes the control device at the end of a maximum write period.

According to one embodiment of the present invention, the part of the control device that is initialized comprises a main state machine and a write state machine.

BRIEF DESCRIPTION OF THE SEVERAL
VIEWS OF THE DRAWINGS

Figure 3:
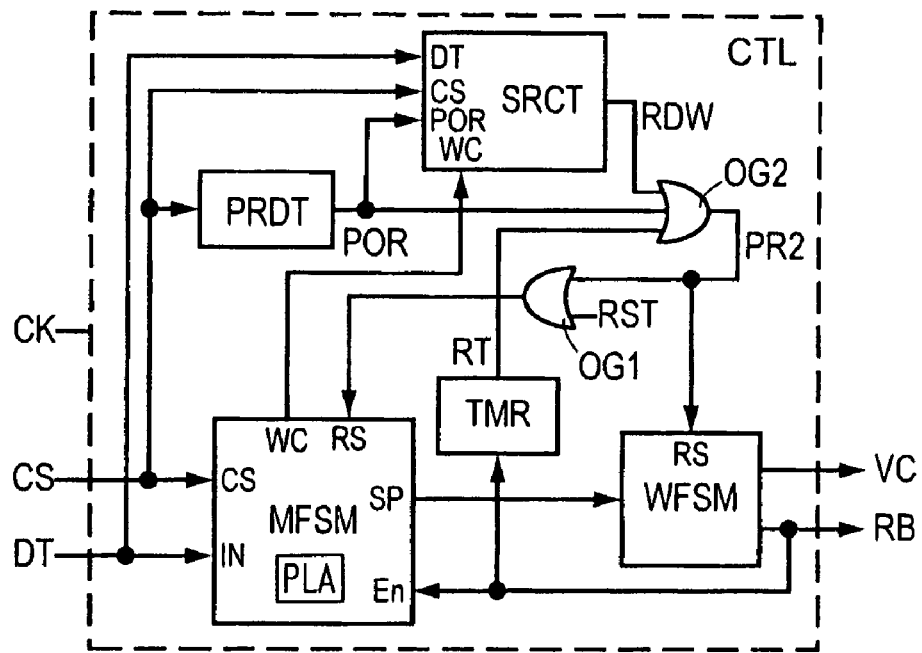
Figure 4:
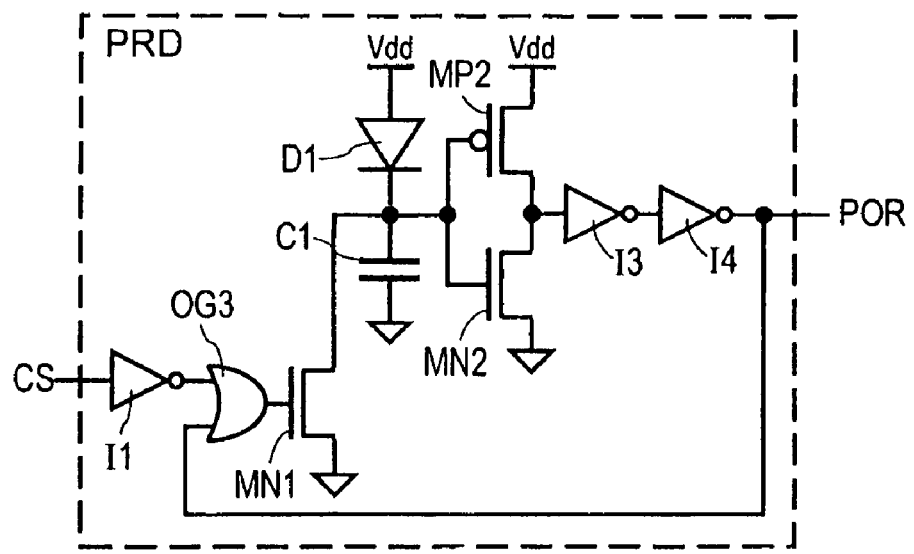
Figure 5:
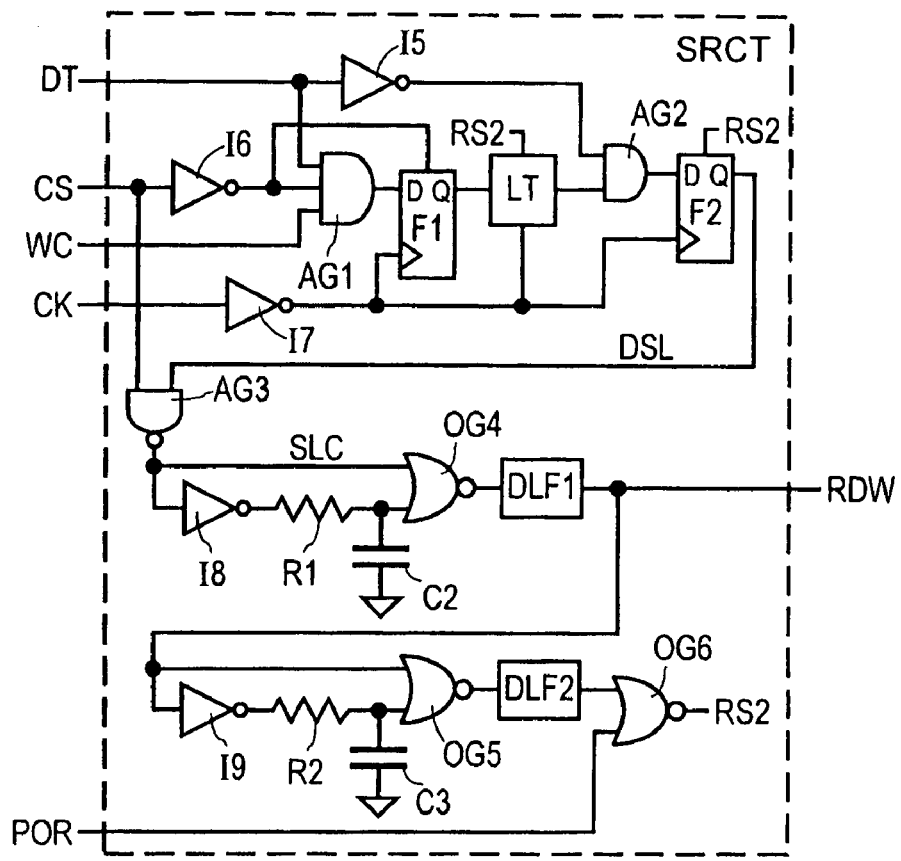
Figure 8:
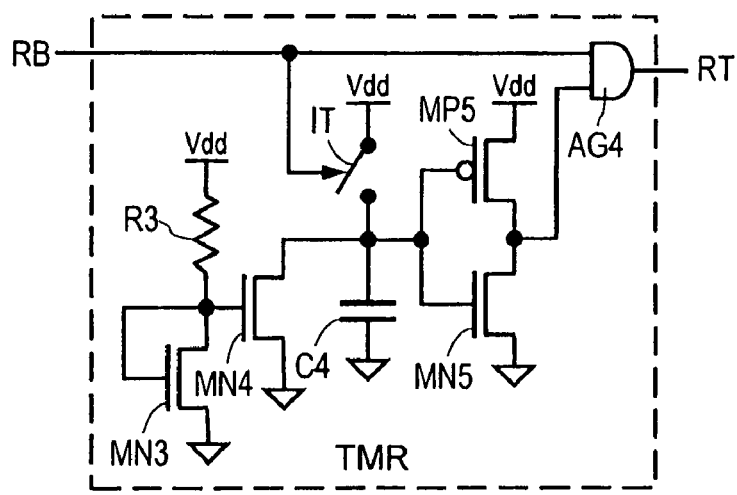
Figure 6:
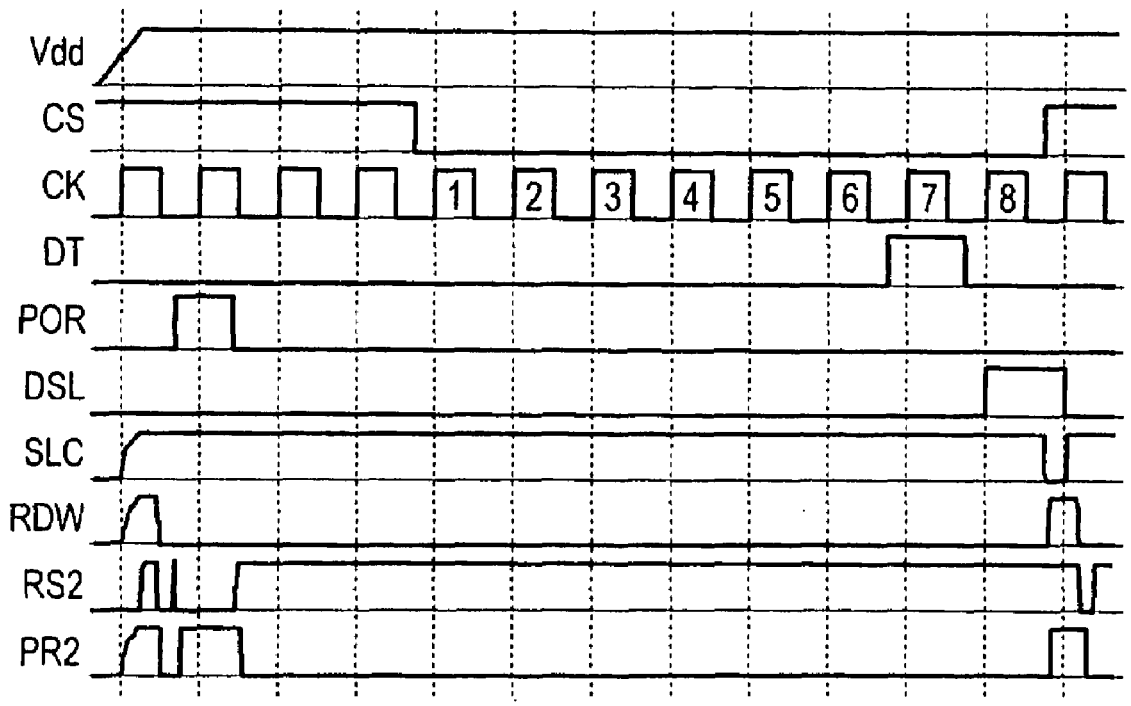
Figure 7:
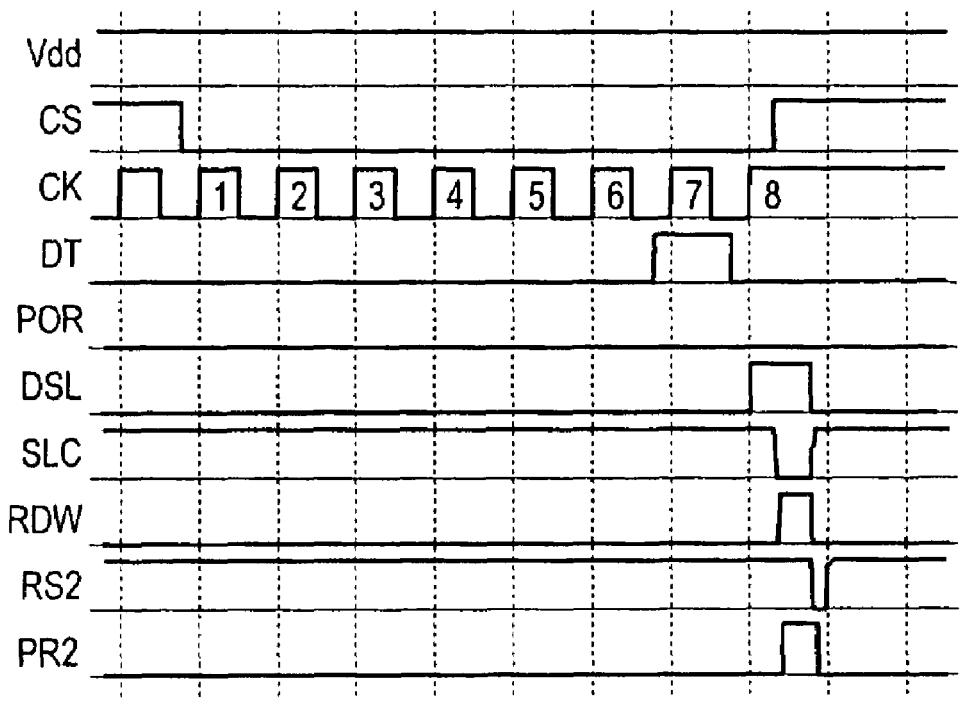

These and other features and advantages of the present invention will be explained in greater detail in the following description of embodiments of the present invention, given in relation with, but not limited to the following figures, in which:

FIG. 1 already described represents in block form an EEPROM memory accessible by a serial bus, FIG. 2 already described represents in block form a classic device for controlling the memory, FIG. 3 represents in block form a control device for controlling a memory, according to the present invention, FIGS. 4 and 5 are wiring diagrams of initialization signal generating circuits, of the control device according to the present invention, FIGS. 6 and 7 are timing diagrams of electric signals showing the operation of the control device according to the present invention, FIG. 8 is a wiring diagram of an initialization signal generating circuit, of the control device according to the present invention.

DETAILED DESCRIPTION OF THE INVENTION

FIG. 3 represents a control device according to one embodiment of the present invention, for controlling the memory MEM represented in FIG. 1. In FIG. 3, the control device CTL comprises a clock signal input CK, a main state machine MFSM, a write state machine WFSM and a detector circuit PRDT for detecting the switching on of the memory MEM and generating an initialization signal POR.

The state machine MFSM particularly decodes the commands applied to the memory. The state machine WFSM supplies the signal VC driving the booster circuit HVCT during the phases of writing the memory. The circuit PRDT activates the signal POR following the switching on of the memory (when the supply voltage Vdd exceeds a certain threshold value). The state machine MFSM receives the selection signal CS for selecting the memory MEM, and the serial control signal DT transmitted by the bus DB for accessing the memory. The state machine MFSM also receives, through an OR-type logic gate OG1, the initialization signal POR and another initialization signal RST used to initialize a programmable logic array PLA of the state machine MFSM at the start of each access to the memory MEM. The signal RST comprises one pulse upon each falling edge of the signal CS. The state machine MFSM supplies the state machine WFSM with a start-write signal SP upon the execution of a write command.

The state machine WFSM is also initialized by the signal POR and supplies the state machine MFSM with a busy signal RB indicating that a write phase is in progress. The signal RB is applied to an activation input En of the state machine MFSM. When the signal RB is active, the state machine MFSM is blocked, but can nonetheless receive a command sent to the memory after the activation of the signal RB.

According to one embodiment of the present invention, the control device CTL comprises an initialization signal generating circuit SRCT, which applies an initialization signal RDW to the state machines MFSM and WFSM.

More precisely, the circuit SRCT generates the initialization signal RDW following the receipt of a control signal WC. The signal RDW is applied to the state machines MFSM and WFSM through an OR-type logic gate OG2 another input of which receives the output signal POR of the circuit PRDT. The output signal PR2 of the gate OG2 is applied to an initialization input RS of the state machines MFSM and WFSM. The signal WC is sent by the state machine MFSM when a specific event is detected in the serial control signal DT.

For example, if the commands applied to the memory are transmitted in accordance with the SPI protocol, the commands comprise 8 bits, and are listed in the following table:

TABLE 1

| Command | Command code | Description |
|---|---|---|
| WREN | 06h | Write authorization |
| RDSR | 05h | Reading of the status register SR |
| WRDI | 04h | Writing prohibited |
| READ | 03h | Reading of a datum in the memory |
| WRITE | 02h | Writing of a datum in the memory |
| WRSR | 01h | Writing in the state register SR |

The commands for writing WRITE and reading READ in the memory are followed by a write or read address, then by the datum to be written in the case of a write command. The command for writing in the status register SR is followed by the datum to be written in the status register. The commands, the addresses and the data are transmitted starting with the most significant bit. The transmissions start when a change to 0 of the selection signal CS appears and end when the signal CS goes back to 1.

To trigger an initialization of the control device CTL, one embodiment of the present invention uses a command normally followed by an address or a datum, without this command being followed by an address or a datum to be written. In Table 1, the commands that may be used to trigger an initialization are WRITE, READ and WRSR. In other words, if the control device receives such a command and the selection signal CS changes back to 1 at the end of the receipt of the eight bits of the command, the control device considers this to be an initialization command.

Thus, one embodiment of the present invention provides an extra initialization command while remaining compatible with the protocol for transmitting the commands to the memory MEM.

In the example of the SPI protocol, the signal WC generated by the state machine MFSM is synchronous with the command received. If the command received by the state machine is the command chosen for the initialization of the circuit, the signal WC is identical to the first seven bits of the command received. Thus, if the initialization command selected is the WRITE (=02 h) command, the signal WC is on 0 for the five first falling edges of the clock signal CK and comprises a pulse on 1 between the sixth and seventh falling edges of the clock signal if the first 6 bits (bits 7 to 2) of the command received are on 0 and if the seventh bit (bit 1) of the command received is on 1.

FIG. 4 represents an example of an embodiment of the generating circuit PRDT. The circuit PRDT comprises an OR gate OG3 receiving the selection signal CS for selecting the memory, previously inverted by an inverter 11. The output of the gate OG3 is connected to the gate of an N-channel MOS transistor MN1. The source of the transistor MN1 is connected to the ground. The circuit PRDT comprises a comparator for comparing the supply voltage Vdd with a voltage threshold. For this purpose, the comparator comprises a diode D1 defining the voltage threshold and the anode of which is connected to the supply voltage source Vdd. The cathode of the diode is linked to the ground through a capacitor C1, and is connected to the drain of the transistor MN1, to the gate of a P-channel MOS transistor MP2, and to the gate of an N-channel MOS transistor MN2. The source of the transistor MP2 receives the supply voltage Vdd. The source of the transistor MN2 is connected to the ground. The drains of the transistors MN2 and MP2 are connected to the input of an inverter 13 the output of which supplies the initialization signal POR through another inverter 14. The initialization signal POR is applied to an input of the gate OG3. The voltage threshold is determined by the threshold voltage of the diode D1.

The signal POR generated by the circuit PRDT has an initialization pulse when the supply voltage Vdd of the memory exceeds the voltage threshold. The gate OG3 and the inverters 13 and 14 enable the width of the initialization pulse of the signal POR to be reduced.

It shall be noted that the diode D1 can be replaced by several diodes mounted in series to adjust the voltage threshold.

FIG. 5 represents an example of an initialization signal generating circuit SRCT when the initialization command chosen is the WRITE command. The circuit SRCT comprises an AND-type logic gate AG1 receiving the serial control signal DT applied to the memory, the selection signal CS previously inverted by an inverter 16, and the signal WC coming from the state machine MFSM and indicating whether or not a specific event is detected in the serial control signal. In the case of the SPI protocol, if this event is detected (receipt of a WRITE command), the signal WC is on 0 and comprises a pulse between the sixth and the seventh falling edge of the clock signal CK, starting from the change to 0 of the signal CS.

The output of the gate AG1 is connected to the D input of a D flip-flop F1. The flip-flop F1 is initialized by the signal CS inverted at output of the inverter 16. The Q output of the flip-flop F1 is connected to the input of a latch LT. The output of the latch LT is connected to the input of an AND-type logic gate AG2 receiving at another input the control signal DT previously inverted by an inverter 15. The output of the gate AG2 is connected to the D input of a D flip-flop F2 the Q output of which supplies a signal DSL. The flip-flops F1 and F2 and the latch LT are paced by the clock signal CK previously inverted by an inverter 17.

The signal DSL is applied with the signal CS to an inverted AND-type logic gate AG3. The signal SLC at output of the gate AG3 is applied to the input of an inverted OR-type logic gate OG4. The signal SLC is also applied to a circuit RC through an inverter 18. The circuit RC comprises a resistor R1 connected on one side to the output of the inverter 18 and on the other side to an input of the gate OG4 and to a capacitor C2 also connected to the ground. The output of the gate OG4 is connected to the input of a falling edge delay circuit DLF1 the output of which supplies the signal RDW. The circuit DLF1 applies a delay to the falling edges of the signal applied at input.

The signal RDW is applied to the input of an inverted OR-type gate OG5 and to a circuit RC through an inverter 19. The circuit RC comprises a resistor R2 connected on one side to the output of the inverter 19 and on the other side to an input of the gate OG5 and to a capacitor C3 also connected to the ground. The output of the gate OG5 is connected to the input of a falling edge delay circuit DLF2 the output of which is connected to the input of an inverted OR-type gate OG6. The signal POR is applied to another input of the gate OG6. The output of the gate OG6 supplies an initialization signal RS2 that is applied to the initialization inputs of the latch LT and of the flip-flop F2.

The operation of the control device CTL is shown by timing diagrams represented in FIGS. 6 and 7. FIGS. 6 and 7 represent the timing diagrams of the signals Vdd, CS, CK, DT, POR, DSL, SLC, RDW, RS2 and PR2 when an initialization command is received by the control device CTL.

FIG. 6 shows an initialization of the memory following the switching on thereof. Upon the switching on, the supply voltage Vdd increases gradually until it reaches its nominal value. The selection signal CS is on 1. The control signal DT is on 0. The increase in the supply voltage Vdd (memory MEM switched on), while the selection signal CS is on 1, triggers the appearance of a pulse in the signal POR emitted by the circuit PRDT.

FIGS. 6 and 7 show the receipt of an initialization command by the memory. If the command sent by the signal DT is an initialization command, i.e., a WRITE (=02 h) command not followed by an address and a datum, it remains on 0 up to the sixth falling edge of the clock signal CK and comprises a pulse upon the seventh falling edge of the signal CK before changing back to 0 upon the eighth falling edge of the signal CK, preceding the rising back up of the signal CS. As a result, during the first six falling edges of the clock signal CK, the output of the gate AG1 remains on 0. The result is that, during this period, the flip-flop F1 remains in the state 0 and the value stored by the latch LT is 0. If the signal WC has a pulse (upon the sixth falling edge of the clock signal), the signal DT is also on 1 at this instant. The output of the gate AG1 therefore goes to 1. The flip-flop F1 then changes state and supplies a signal on 1 at output. This signal value is stored by the latch LT. As the signal DT is on 1 and is inverted by the inverter I5, the output of the gate AG2 remains on 0. The state of the flip-flop F2 is also on 0. Then, the last bit of the command is applied at input of the inverter I5. If the last bit of the command received is on 0, the output of the gate AG2 changes to 1, just like the flip-flop F2. In the opposite case, the flip-flop F2 remains in the state 0. As a result, the output signal DSL of the flip-flop F2 is on 1 when the command applied at input is equal to 02 h. The signal DSL remains on 1 up to the rising edge of the clock signal CK following the change to 1 of the selection signal CS. In the time interval between the rising of the signal CS and the falling of the signal DSL, the output signal SLC of the gate AG3, normally on 1, changes to 0. The result is that the output of the gate OG4 changes to 1 up to a certain charge threshold of the capacitor C2. The signal RDW changes to 1 at the same time as the output signal of the gate OG4. The change to 0 of the signal RDW is delayed by the circuit DLF1 in relation to the change to 1 of the signal SLC. The delay applied by the circuit DLF1 is adjusted to obtain a certain width of the pulse of the signal RDW.

The circuit formed by the gate OG4, the inverter I8 and the circuit RC R1, C2 therefore enables a pulse to be generated at output upon a state change of the signal SLC. The signal RDW thus comprises an initialization pulse if the command received is a write command immediately followed (upon the ninth bit of the command) by the rising back up of the signal CS. The initialization signal PR2 generated from the signal RDW in particular, is therefore active following the rising back to 1 of the selection signal CS.

It shall be noted that the flip-flop F1 is initialized upon the rising back up of the signal CS. This initialization has no impact on the value of the signal RDW as the latter is determined using the state of the latch LT and of the flip-flop F2 which are not yet initialized.

The signal RDW is used to generate the initialization signal RS2. When the signal RDW is on 0, the signal RS2 is on 1. When the signal RDW changes to 1, the output of the gate OG5 remains on 0 and therefore the signal RS2 remains on 1. When the signal RDW changes back to 0, the output of the gate OG5 changes to 1 and therefore the signal RS2 changes to 0 with a certain delay applied by the circuit DLF2 and remains on 0 for the charge time of the capacitor C3.

The circuit formed by the gate OG5, the inverter I9 and the circuit RC R2, C3 enables an initialization pulse to be generated immediately after the initialization pulse of the signal RDW. The signal RS2 thus generated comprises a pulse enabling the latch LT and the flip-flop F2 to be initialized immediately after the initialization of the control circuit CTL. The delay applied by the circuit DLF2 is adjusted to increase the width of the initialization pulse of the signal RS2 and so that this pulse only appears following the fall back of the signal RDW.

It shall be noted that upon the switching on of the circuit SRCT, pulses appear in the signals RDW and RS2. These pulses do not disturb the operation of the circuit since they are generated during a period in which the memory MEM is not selected, and before the generation of the initialization signal POR.

FIG. 7 shows in particular the case in which the clock signal CK remains in the high state following the rising back up of the selection signal CS, i.e., upon the eighth clock stroke following the change to 0 of the signal CS. FIG. 7 shows that the absence of the ninth clock stroke does not prevent the generation of an initialization pulse in the signal RDW. Indeed, the change to 1 of the signal RDW is triggered by the eighth clock stroke and the change to 0 of the signal RDW is linked to the deselection of the memory (change to 1 of the signal CS).

In a preferred embodiment of the present invention shown by FIG. 3, the control device comprises a time delay circuit TMR. The time delay circuit is triggered at the start of the execution of a write command in the memory MEM by the change to 1 of the signal RB. The duration of the delay is chosen to be slightly higher than the time for writing a word in the memory, for example 10 ms. If the delay ends before the signal RB changes to 0, the circuit TMR sends a signal RT that is applied to an input of the gate OG2 to trigger an initialization of the control device CTL.

An example of a time delay circuit is represented in FIG. 8. The time delay circuit TMR comprises a diode-mounted N-channel MOS transistor MN3, i.e., the gate of which is connected to the drain. The drain of the transistor MN3 is also linked to the supply voltage source Vdd through a resistor R3, and the source of this transistor is connected to the ground. The drain of the transistor MN3 is also connected to the gate of an N-channel MOS transistor MN4 the source of which is connected to the ground. The drain of the transistor MN4 is linked to the ground through a capacitor C4 and to the supply voltage source Vdd through a switch IT. The switch IT is controlled by the signal RB and is closed when the signal RB is on 0. The drain of the transistor MN4 is connected to the gate of a P-channel MOS transistor MP5 and to the gate of an N-channel MOS transistor MN5. The source of the transistor MP5 is connected to the supply voltage source Vdd. The source of the transistor MN5 is connected to the ground. The drains of the transistors MP5 and MN5 are connected to the input of an AND-type logic gate AG4 another input of which receives the signal RB and the output of which supplies the initialization signal RT.

When the circuit is initialized, the signal RB is on 0 and therefore the switch IT is closed. The result is that the capacitor C4 is charged. Therefore, the output signal of the inverter formed by the transistors MP5 and MN5 is on 0. As a result, the signal RT is on 0.

When the signal RB changes to 1 at the start of the execution of a read command, the switch IT is open. The result is that the capacitor C4 discharges through the transistor MN4. The duration of the discharge of the capacitor is adjusted by the bias of the transistor MN3. If the signal RB changes to 0 before the voltage at the terminals of the capacitor C4 drops below the threshold voltage of the transistor MN5, the switch IT closes and the capacitor is charged again. In the opposite case, the signal applied to the gate AG4 by the inverter formed by the transistors MP5, MN5 changes to 1. If the signal RB is still on 1, the signal RT sent by the time delay circuit TMR changes to 1, which triggers the initialization of the state machines MFSM and WFSM. The result is that the signal RB changes back to 0, which cancels the signal RT.

Providing the time delay circuit TMR avoids the cases of blocking the memory which would not be avoided with the circuit SRCT.

It will be understood by those skilled in the art that various alternative embodiments and applications of the present invention are possible. In particular, the present invention is not limited to memories accessible by an SPI bus. It applies more generally to any memory accessible by a serial bus.

The event triggering the initialization of the control circuit is not necessarily included in the data signal applied to the memory. This event can be detected in another signal applied to the memory to trigger an initialization of the memory equivalent to the one performed upon the switching on. When this event is detected in the data signal, any event other than the receipt of a write or read command can be used to trigger the initialization of the control circuit. This may, for example, be a specific command. For example, as the commands provided in the SPI protocol start with a 0 for five clock cycles, provision can be made for the initialization command to start with a 1 for one or more clock cycles.

Furthermore, it shall be noted that the partial initialization of the initialization circuit SRCT, following the initialization of the state machines of the control circuit is only provided due to the nature of the initialization command to be detected. Indeed, this initialization of the circuit SRCT is only necessary due to the presence of the flip-flop F2 and of the latch LT which can only be initialized after having generated the initialization signal RDW.

The invention claimed is:

1. A method comprising:
    detecting a switching on of a memory having a control device that executes commands for accessing the memory wherein the commands are transmitted to the memory by a control signal;
    at least partially initializing the control device following the switching on of the memory;
    detecting a specific event in the control signal;
    at least partially initializing the control device following the detection of the specific event;
    wherein the specific event is a write or read command for reading or writing in the memory and is not associated with a write or read address; and
    wherein the write or read command received by the memory is considered to be an initialization command if the memory is in a busy state, and a selection signal for selecting the memory changes state before a write or read address is received by the memory, but following the receipt of the read or write command.

2. The method according to claim 1, further comprising a step of initializing an initialization circuit detecting the specific event, following the initialization of the control device.

3. The method according to claim 1, wherein the specific event is an initialization command received by the memory.

4. The method according to claim 1, further comprising a step of at least partially initializing the control device if a write command for writing in the memory is still being executed at an end of a maximum write period.

5. The method according to claim 1, wherein at least partially initializing the control device includes initializing a main state machine and a write state machine.

6. A memory comprising:
    a control device operable to execute commands for accessing the memory, the commands being received via a control signal applied to the memory;
    a detector circuit operable to detect a switching on of the memory and at least partially initializing the control device following the switching on of the memory,
    an initialization circuit detecting a specific event in the control signal and at least partially initializing the control device, following the detection of the specific event;
    wherein the specific event is a write or read command for reading or writing in the memory and is not associated with a write or read address; and
    wherein the write or read command received by the memory is considered to be an initialization command if the memory is in a busy state, and a selection signal for selecting the memory changes state before a write or read address is received by the memory, but following the receipt of the read or write command.

7. Memory according to claim 6, wherein the initialization circuit is at least partially reset following the initialization of the control device.

8. The memory according to claim 6, wherein the specific event is an initialization command received by the memory.

9. The memory according to claim 6, further comprising a time delay circuit triggered at a start of an execution of a write command in the memory and operable to at least partially initialize the control device at an end of a maximum write period.

10. The memory according to claim 6, wherein a part of the control device that is initialized includes a main state machine and a write state machine.

11. A memory system comprising:
    a memory device;
    control means for executing commands to access the memory device, the commands being transmitted via a control signal applied to the memory device;
    detector means for detecting an enabling of the memory device and at least partially initializing the control means following the enabling of the memory device;
    initialization means for detecting an event within the control signal and at least partially initializing the control means upon detecting the event;
    wherein the event is a write or read command for reading or writing in the memory and is not associated with a write or read address; and
    wherein the write or read command received by the memory is considered to be an initialization command if the memory is in a busy state, and a selection signal for selecting the memory changes state before a write or read address is received by the memory, but following the receipt of the read or write command.

12. The memory system of claim 11 wherein the initialization means is at least partially reset upon the at least partial initialization of the control means.

13. The memory system of claim 11 wherein the event is an initializing command received by the memory device.

14. The memory device of claim 11, further comprising a time delay means for at least partially initializing the control means at an end of a maximum write period wherein the time delay means is triggered at a start of an execution of a write command in the memory device.

* * * * *